United States Patent
Mizoguchi et al.

(10) Patent No.: US 8,854,047 B2
(45) Date of Patent: Oct. 7, 2014

(54) VOLTAGE MONITOR FOR MONITORING VOLTAGE OF A BATTERY

(75) Inventors: Tomomichi Mizoguchi, Nagoya (JP);
Takumi Shimizu, Yokkaichi (JP);
Keisuke Tanigawa, Nishio (JP);
Manabu Sasaki, Toyota (JP); Yoshiaki Kikuchi, Toyota (JP); Ryo Mano, Toyota (JP); Jyunta Izumi, Toyota (JP);
Teruo Ishishita, Miyoshi (JP)

(73) Assignees: Denso Corporation, Kariya (JP);
Toyota Jidosha Kabushiki Kaisha, Toyota-shi (JP)

( * ) Notice: Subject to any disclaimer, the term of this patent is extended or adjusted under 35 U.S.C. 154(b) by 605 days.

(21) Appl. No.: 13/206,841

(22) Filed: Aug. 10, 2011

(65) Prior Publication Data

US 2012/0001639 A1 Jan. 5, 2012

Related U.S. Application Data

(63) Continuation of application No. PCT/JP2010/066850, filed on Sep. 28, 2010.

(30) Foreign Application Priority Data

Sep. 29, 2009 (JP) ................................. 2009-224954

(51) Int. Cl.
*G01N 27/416* (2006.01)
*G01R 19/165* (2006.01)
*G01R 35/00* (2006.01)

(52) U.S. Cl.
CPC .......... *G01R 19/16542* (2013.01); *G01R 35/00* (2013.01)

USPC .................................... 324/433; 320/126

(58) Field of Classification Search
USPC ....................................................... 324/433
See application file for complete search history.

(56) References Cited

U.S. PATENT DOCUMENTS

| 5,698,965 A | 12/1997 | York |
| 5,705,914 A | 1/1998 | Morita |
| 6,194,868 B1 | 2/2001 | De Boer |

(Continued)

FOREIGN PATENT DOCUMENTS

| JP | 2003-32907 | 1/2003 |
| JP | 2003-92840 | 3/2003 |

(Continued)

OTHER PUBLICATIONS

Extended European Search Report (9 pages) dated Oct. 2, 2013, issued in corresponding European Application 10820526.1-1560

(Continued)

*Primary Examiner* — Arun Williams
(74) *Attorney, Agent, or Firm* — Nixon & Vanderhye PC

(57) ABSTRACT

A first monitor circuit 50 and a second monitor circuit 60 each having an identical configuration are provided in a voltage monitor. A threshold switching section 41 switches a threshold of each of switching units 51 and 61 provided in the respective monitor circuits 50 and 60 to a same value. Each of comparators 53 and 63 compares the threshold with a reference voltage to output a result of the comparison. A fault detecting section 42 compares the respective outputs from the comparators 53 and 63 with each other to detect a characteristic shift of the threshold of each of the monitor circuits 50 and 60.

7 Claims, 3 Drawing Sheets

(56) References Cited

U.S. PATENT DOCUMENTS

| | | | |
|---|---|---|---|
| 6,373,256 | B1 | 4/2002 | Hanjani et al. |
| 7,369,382 | B2* | 5/2008 | Scheikl et al. ................. 361/90 |
| 7,568,117 | B1* | 7/2009 | Fernald ......................... 713/340 |
| 2003/0015995 | A1 | 1/2003 | Tamura et al. |
| 2005/0237023 | A1* | 10/2005 | Zhang ........................... 320/128 |
| 2006/0113969 | A1 | 6/2006 | Hatanaka |
| 2007/0114973 | A1 | 5/2007 | Miyamoto |
| 2007/0268000 | A1 | 11/2007 | Kobayashi et al. |
| 2008/0001575 | A1 | 1/2008 | Bonin et al. |
| 2011/0074435 | A1 | 3/2011 | Mizoguchi |

FOREIGN PATENT DOCUMENTS

| | | |
|---|---|---|
| JP | 2004-134287 | 4/2004 |
| JP | 2004-328886 | 11/2004 |
| JP | 2006-64639 | 3/2006 |
| JP | 2007-278913 | 10/2007 |
| JP | 2009-192477 | 8/2009 |
| JP | 2009-216447 | 9/2009 |
| JP | 2011-078164 | 4/2011 |
| JP | P2011-078163 A | 4/2011 |
| WO | WO 2011/040412 | 4/2011 |

OTHER PUBLICATIONS

Low et al., Application Note "Supervisor ICs Monitor Battery-Powered Equipment", Microprocessors and Microsystems, IPC Business Press, Ltd., vol. 20, No. 7, (Mar. 1997), pp. 437-442.

U.S. Appl. No. 13/499,084 of Tanigawa et al, filed Mar. 29, 2012 (corresponds to JP 2011-078163A).

International Preliminary Report on Patentability and Written Opinion for PCT/JP2010/066850, dated Apr. 12, 2012, with English translation, 9 pages.

International Search Report for PCT/JP2010/066850, mailed Dec. 21, 2010.

* cited by examiner

VOLTAGE MONITOR FOR MONITORING VOLTAGE OF A BATTERY

This application is a continuation of International Application No. PCT/JP2010/066850 filed 28 Sep. 2010 which designated the U.S. and which claims priority to Application No. JP 2009-224954 filed 29 Sep. 2009, the entire contents of each of which are hereby incorporated by reference.

TECHNICAL FIELD OF THE INVENTION

The present invention relates to voltage monitors for batteries.

BACKGROUND ART

There are conventionally battery controllers with a function of detecting the spontaneous change of a threshold for detecting overcharging and/or overdischarging of a battery, as an example of which is proposed in a first patent document. Specifically, this structure disclosed in the first patent document is to detect the voltage of a battery, and compare the detected voltage with the threshold.

When comparing the battery voltage with the threshold, this structure forcibly shifts the threshold from its original value by a constant value, that is, switches the threshold in one step. Then, the voltage controller determines that there is a great spontaneous change in the threshold when the magnitude relation between the threshold and the battery voltage is not reversed irrespective of the forcible shift of the threshold. This makes it possible to detect the characteristic shift of the threshold.

ART DISCUSSED ABOVE

Patent Document

First patent document: 2003-92840

DISCLOSURE OF THE INVENTION

Problems to be Solved by the Invention

However, in the above conventional art, when the threshold is shifted in one step, even if a spontaneous change in the threshold shifts the characteristic of the threshold, a failure of means for shifting the threshold may cause the magnitude relation between the threshold and the battery voltage to be reversed. For this reason, there is a problem with the conventional art; this problem is that the determination of the characteristic shift of the threshold has a low reliability.

In view of the above points, the present invention has an object to provide a voltage monitor capable of improving the reliability of determination of a characteristic shift of a threshold.

Means for Solving the Problems

In order to achieve such a purpose provided above, an invention according to a first example embodiment is a voltage monitor for monitoring a voltage of a battery based on a monitor threshold value and for diagnosing the voltage of the battery based on first and second diagnostic threshold values. The voltage monitor includes a first means that obtains a first relative correlation between the voltage of the battery and any one of the monitor threshold value and the first diagnostic threshold value, and outputs first information indicative of the obtained first relative correlation. The voltage monitor includes a second means that obtains a second relative correlation between the voltage of the battery and any one of the monitor threshold value and the second diagnostic threshold value, and outputs second information indicative of the obtained second relative correlation. The voltage monitor includes a threshold switching means that switches a threshold used by the first means to the monitor threshold value and a threshold used by the second means to the monitor threshold value when carrying out the monitor, and that switches the threshold used by the first means to the first diagnostic threshold value and the threshold used by the second means to the second diagnostic threshold value that is a same value as the first diagnostic threshold value when carrying out the diagnosis. The voltage monitor includes a fault detecting means that: receives the first information outputted from the first means and the second information outputted from the second means after the first and second threshold values have been switched to the same value; and detects that there is a fault in a threshold switched by the threshold switching means if the first information of the first means is different from the second information of the second means.

Because a duplex system, which relatively compares the first information and the second information from the first means and second means when the first diagnostic threshold value and the second diagnostic threshold value used by the first and second means are switched to a same value by the threshold switching means for diagnosis, is constructed, the first information and the second information are identical to each other if there are no characteristic shifts. If there is a characteristic shift, the first information is different from the second information. Specifically, detecting that the first information is different from the second information allows detection of a characteristic shift of a threshold value in any one of the first means and the second means. Thus, it is possible to improve the reliability of determination of characteristic shifts of threshold values.

In an invention described in a second example embodiment, the threshold switching means switches the first diagnostic threshold value and the second diagnostic threshold value in several steps.

Because the first diagnostic threshold value and the second diagnostic threshold value are switched in several steps, it is possible to compare each of the diagnostic threshold values at each step with the voltage of the battery. Specifically, even if the magnitude relation between a threshold switched in one step and the battery voltage is not reversed, finely switching the threshold in several steps obtains a compared result representing that the magnitude relation between a threshold value and the battery voltage is reversed in any one of comparing means due to a characteristic shift of a threshold value, and obtains a compared result representing that the magnitude relation is not reversed in the other thereof. Thus, it is possible to improve the accuracy of determination of characteristic shifts of threshold values.

Particularly, if the battery voltage is kept unchanged, stepwisely switching a threshold relative to the constant battery voltage allows the magnitude relation between the threshold and the battery voltage to be reversed.

In an invention described in a third example embodiment, the fault detecting means detects that there is a fault in one of the threshold used by the first means and the threshold used by the second means if values of the first information at two or more steps in the several steps are successively different from corresponding values of the second information at the same two or more steps in the several steps.

Because there is a fault when it is detected that values of the first information at two or more steps in the several steps are successively different from corresponding values of the second information at the same two or more steps in the several steps, it is possible to prevent fault detection. Thus, it is possible to improve the accuracy of determination of threshold characteristic shifts.

In an invention described in a fourth example embodiment, the first means includes:
- a first voltage dividing means that outputs a voltage corresponding to one of the monitor threshold value and the first diagnostic threshold value as a divided voltage of the voltage of the battery;
- a first reference voltage source that outputs a first reference voltage; and
- a first comparator that receives the divided voltage of the first voltage dividing means and the first reference voltage of the first reference voltage source, and that outputs a result of a comparison between the divided voltage of the first voltage dividing means and the first reference voltage of the first reference voltage source as the first information, the second means includes:
- a second voltage dividing means that outputs a voltage corresponding to one of the monitor threshold value and the second diagnostic threshold value as a divided voltage of the voltage of the battery;
- a second reference voltage source that outputs a second reference voltage; and
- a second comparator that receives the divided voltage of the second voltage dividing means and the second reference voltage of the second reference voltage source, and that outputs a result of a comparison between the divided voltage of the second voltage dividing means and the second reference voltage of the second reference voltage source as the second information, and the threshold switching means switches each of a ratio of the divided voltage of the first voltage dividing means relative to the voltage of the battery and a ratio of the divided voltage of the second voltage dividing means relative to the voltage of the battery to switch the threshold used by the first means to the first diagnostic threshold value, and switch the threshold used by the second means to the second diagnostic threshold value.

Configuration of each of the first means and the second means set forth above allows output of relative correlations between the battery voltage and the threshold values.

In an invention described in a fifth example embodiment, the first and second diagnostic threshold values are set to be within a voltage range to be used by the battery.

This makes it possible to prevent stepwise switching of each of the first and second diagnostic threshold values within the total range from the lowest value to the highest value of the battery voltage.

In an invention described in a sixth example embodiment, the first means includes:
- a first voltage dividing means that divides a reference voltage to output a divided voltage corresponding to one of the monitor threshold value and the first diagnostic threshold value; and
- a first comparator that receives the divided voltage of the first voltage dividing means and the voltage of the battery, and compares the divided voltage with the voltage of the battery to output a result of the comparison as the first information, the second means includes:
- a second voltage dividing means that divides the reference voltage to output a divided voltage corresponding to one of the monitor threshold value and the second diagnostic threshold value; and
- a second comparator that receives the divided voltage of the second voltage dividing means and the voltage of the battery, and compares the divided voltage with the voltage of the battery to output a result of the comparison as the second information, and the threshold switching means switches each of a ratio of the divided voltage of the first voltage dividing means relative to the voltage of the battery and a ratio of the divided voltage of the second voltage dividing means relative to the voltage of the battery to switch the threshold used by the first means to the first diagnostic threshold value, and switch the threshold used by the second means to the second diagnostic threshold value.

Configuration of each of the first means and the second means set forth above allows output of relative correlations between the battery voltage and the divided voltage corresponding to the threshold as a result of the comparison between the battery voltage and the threshold.

DESCRIPTION OF EMBODIMENTS

Figure 1:
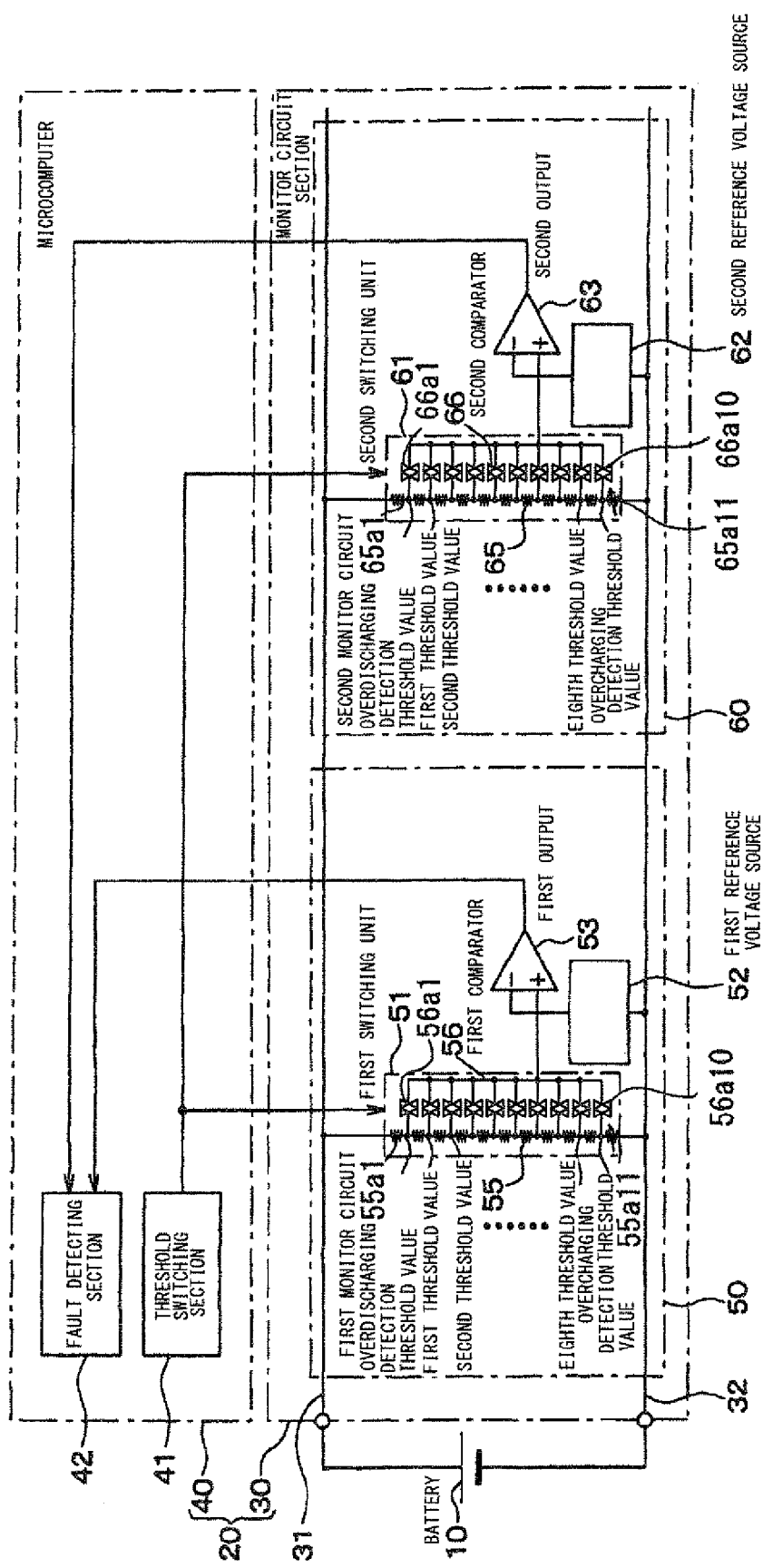
FIG. 1 is an overall structural view of a voltage monitoring system including a voltage monitor according to an embodiment of the present invention.

An embodiment of the present invention will be described hereinafter with reference to the drawings. FIG. 1 is an overall structural view of a voltage monitoring system including a voltage monitor according to the embodiment of the present invention. As illustrated in FIG. 1, the voltage monitoring system is comprised of a battery 10 and a voltage monitor 20.

The battery 10 is a voltage source capable of generating a constant voltage. This battery 10 is, for example, used as a power source for driving loads or a power source for electronic devices. As the battery 10, for example, a primary battery that is not chargeable or a chargeable secondary battery can be used. In this embodiment, a lithium ion secondary battery is used.

The voltage monitor 20 has an overcharging and overdischarging detecting function for detecting overcharging and overdischarging of the battery 10 as a secondary battery and a self-diagnostic function for diagnosing characteristic shifts of threshold values for the detection of the overcharging and overdischarging.

The overcharging and overdischarging detecting function is a function of comparing the voltage of the battery 10 with predetermined values (threshold values) to thereby monitor the voltage of the battery 10. When the battery 10 is a secondary battery, the voltage monitor 20 monitors whether the voltage of the battery 10 is between a constant value (threshold value) for detecting the overcharging and a constant value (threshold value) for detecting overdischarging inclusive.

The self-diagnostic function is a function of detecting that the threshold values for detecting overcharging and overdischarging have been changed from any cause, such as circuit failure. Specifically, the self-diagnostic function uses diagnostic threshold values for diagnosing whether there is a failure in the threshold values for detecting overcharging and overdischarging to detect an abnormality, such as a failure and a disturbance in each unit constituting the overcharging and overdischarging detecting function.

The voltage monitor 20 set forth above is equipped with a monitor circuit section 30 and a microcomputer 40.

The monitor circuit section 30 includes a first monitor circuit 50 and a second monitor circuit 60, and these first and second monitor circuits 50 and 60 constitute a duplex circuit. Specifically, the first monitor circuit 50 and the second monitor 60 have an identical configuration. The monitor circuit section 30 is designed as an IC.

The first monitor circuit 50 is adapted to compare threshold values with the voltage of the battery 10 to output results of the comparisons, and provided with a first switching unit 51, a first reference voltage source 52, and a first comparator 53.

The first switching unit 51 is operative to generate, from the voltage of the battery 10, threshold voltages corresponding to the threshold values. For this reason, the first switching unit 51 is connected between a first wire 31 electrically connected with the positive potential of the battery 10 and a second wire 32 electrically connected with the negative potential of the battery 10.

The first switching unit 51 set forth above is equipped with a plurality of resistors 55 and a plurality of switches 56 in order to generate the threshold voltages as the threshold values. The resistors 55 are connected in series between the first wire 31 and the second wire 32.

Each of the switches 56 is designed as, for example, a resistor element and/or a transistor, and has an input terminal and an output terminal. Each switch 56 is adapted to be turned on and off under control to permit current conduction between the input and output terminals and reject current conduction therebetween. The number of the switches 56 is set to be lower by one than the number of the resistors 55. There are connection points between adjacent pairs of the resistors 55. With each connection point, the input terminal of a corresponding switch 56 is connected. This results in that the switches 56 are connected in parallel to each other. The output terminals of the respective switches 56 are commonly connected with each other, which is connected with a non-inverting input terminal (+ terminal) of the first comparator 53.

In this embodiment, eleven resistors 55a1 to 55a11 are connected in series, and each of ten switches 56a1 to 56a10 is connected with the connection point of a corresponding pair of the resistors 55. The switch 56a10, disposed closest to the second wire 32 in the switches 56a1 to 56a10, is a switch 56 for detection of overcharging. In contrast, the switch 56a1, disposed closest to the first wire 31 in the switches 56, is a switch for detection of overdischarging.

When any one of the switches 56 is turned on, the voltage of the battery 10 is divided by the resistors 55, and a divided voltage is inputted to the non-inverting input terminal of the first comparator 53 as a threshold voltage. Thus, when the switch 56 closest to the first wire 31 in the switches 56 is turned on, a divided voltage by the one resistor 55 connected with the first wire 31 and the ten resistors 55 connected with the second wire 32 is inputted to the first comparator 53 as an overdischarging detection threshold value, that is, a threshold voltage.

As described above, switching between the switches 26 allows a divided voltage corresponding to any one of an overcharging detection threshold value, first to eighth threshold values, and the overdischarging detection threshold value to be outputted as a threshold voltage from the first switching unit 51 to the first comparator 53.

These overcharging detection threshold value, first to eighth threshold values, and overdischarging detection threshold value are set to be within a range of the voltage of the battery 10. When a lithium ion battery is used as the battery 10, the overdischarging detection threshold value is set to be, for example, 4.25 V, and the overcharging detection threshold value is set to be, for example, 1.75 V. Thus, the first to eighth threshold values are set to be within a usage range of the battery 10 between the overcharging detection threshold value and the overdischarging detection threshold value, such as a range from 1.75 V to 4.25 V.

In addition, the first to eighth threshold values allow the voltage monitor 20 to carry out self-diagnosis for detecting a characteristic shift of a threshold. The first to eighth threshold values are set such that a constant value is shifted step-by-step. For example, when the constant value is set to 0.1 V, the first to eighth threshold values are determined such that the difference between the first and second threshold values is set to 0.1 V, and the difference between the second and third threshold values is set to 0.1 V. In other words, the resistances of the resistors 55a1 to 55a 11 are determined such that the first to eighth threshold values are changed stepwise by a constant value. In this embodiment, for self-diagnosis, the first to eighth threshold values are switched stepwise from the highest first threshold value to the lowest eighth threshold value.

As described above, the first to eighth threshold values are set to be within the range of the voltage used by the battery 10, and can be switched stepwise within the voltage range. Setting each threshold value in this manner prevents stepwise switching of a diagnostic threshold from the lowest value to the highest value of the voltage of the battery 10.

The first reference voltage source 52 is a voltage source for generating a constant first reference voltage. The first reference voltage source 52 is connected between the non-inverting input terminal (− terminal) of the first comparator 53 and the second wire 32.

The first comparator 53 has the non-inverting input terminal, an inverting input terminal, and an output terminal. When a threshold voltage is inputted from the first switching unit 51 and the first reference voltage is inputted from the first reference voltage source 52, the first comparator 53 is adapted to output a result of the comparison between them as a first output. As the first comparator 53, a comparator can be used.

As described above, the first reference voltage is inputted to the inverting input terminal, and a threshold voltage is inputted to the non-inverting input terminal. Thus, when a threshold voltage is higher than the first reference voltage, a high-level signal is obtained, and when a threshold voltage is lower than the first reference voltage, a low-level signal is obtained.

The second monitor circuit 60 together with the first monitor circuit 50 constitutes a duplex circuit. The circuit configuration of the second monitor circuit 60 is the same as that of the first monitor circuit 50. Specifically, the second monitor circuit 60 is adapted to compare threshold values with the voltage of the battery 10 to output results of the comparisons, and provided with a second switching unit 61, a second reference voltage source 62, and a second comparator 63.

The second switching unit 61, like the first switching unit 51, is operative to generate, from the voltage of the battery 10, threshold voltages corresponding to the thresholds, and is connected between the first wire 31 and the second wire 32. The second switching unit 61, which has the same structure as the first switching unit 51, a plurality of resistors 65a1 to 65a11, and a plurality of switches 66a1 to 66a10.

The connection configuration between the resistors 65a1 to 65a11 and the switches 66a1 to 66a10 is identical to that between the resistors 55a1 to 55a11 and the switches 56a1 to 56a10. The output terminals of the respective switches 66 are commonly connected with each other, which is connected with a non-inverting input terminal (+ terminal) of the second comparator 63. The configuration of the switches 66 is identical to that of the switches 56 of the first switching unit 51.

Overcharging detection threshold value, first to eighth threshold values, and overdischarging detection threshold value in the second switching unit 61 are set to be the same as the overcharging detection threshold value, first to eighth threshold values, and overdischarging detection threshold value in the first switching unit 51. Switching between the switches 66 allows a divided voltage corresponding to any one of the overcharging detection threshold value, first to eighth threshold values, and overdischarging detection threshold value to be outputted from the second switching unit 61 to the second comparator 63 as a threshold voltage.

The second reference voltage source 62, as well as the first reference voltage source 52, is a voltage source for generating a constant second reference voltage. The second reference voltage generated by the second reference voltage source 62 is the same as the first reference voltage generated by the first reference voltage source 52. The second reference voltage source 62 is connected between the non-inverting input terminal of the second comparator (− terminal) 63 and the second wire 32.

When a threshold voltage is inputted from the second switching unit 61 and the second reference voltage is inputted from the second reference voltage source 62, the second comparator 63 is adapted to output a result of the comparison between them as a second output. As the second comparator 63, a comparator can be used like the first comparator 53.

The second reference voltage is inputted to an inverting input terminal of the second comparator 63, and a threshold voltage is inputted to the non-inverting input terminal. Thus, when a threshold voltage is higher than the second reference voltage, the second output becomes a high-level signal, and when a threshold voltage is lower than the second reference voltage, the second output becomes a low-level signal.

As described above, the first monitor circuit 50 and the second monitor circuit 60 are identical in configuration to each other. That is, the monitor circuit 30 is equipped with such a duplex circuit.

The microcomputer 40 is equipped with a clock, a CPU, a ROM, an EEPROM, a RAM, and so on. The clock is adapted to generate cyclic successive pulses as a clock signal. The CPU is adapted to run instructions of programs stored in the ROM and the like at the rate (cycle) of the clock signal.

For example, the CPU carries out an overdischarging/charging monitoring process, and a self-diagnostic process for detecting characteristic shifts of the threshold values.

The microcomputer 40 is functionally equipped with a threshold-switching section 41 and a fault detecting section 42 for performing the overdischarging/charging monitoring process and the self-diagnostic process for detecting characteristic shifts of the threshold values. The threshold-switching section 41 and the fault detecting section 42 can be implemented by a hardware circuit, hardware, and/or a program installed in the computer.

The threshold switching section 41 is adapted to switch on/off of each switch 56 of the first switching unit 51 and on/off of each switch 66 of the second switching unit 61 by outputting instructions to the first and second switching units 51 and 61. Specifically, the threshold switching section 41 is operative to switch the voltage-division ratio of the first switching unit 51, and switch the voltage-division ratio of the second switching unit 61.

Note that the "voltage-division ratio of the first switching unit 51" is the ratio between a resistor(s) at the first wire 31 side and a resistor(s) at the second wire 32 side in the series-connected eleven resistors 55a 1 to 55a 11. For example, a voltage corresponding to the overdischarging detection threshold value is a divided voltage by the one resistor 55 connected with the first wire 31 and the remaining series-connected ten resistors 55a2 to 55a11. In this case, "switching the voltage-division ratio of the first switching unit 51" is to turn on the switch 56a1 connected with the connecting point between the resistor 55a 1 connected with the first wire 31 and the resistor 55a2 connected with the resistor 55a 1, and to turn off the remaining switches 56a2 to 56a10. These are similarly established in the "voltage-division ratio of the second switching unit 61 and "switching the voltage-division ratio of the second switching unit 61".

Specifically, when the microcomputer 40 monitors overcharging/overdischarging, the threshold switching section 41 outputs, to the first switching unit 51, an instruction to switch between the switches 56, and, to the second switching unit 61, an instruction to switch between the switches 66 to cause each of the first and second switching units 51 and 61 to output a threshold voltage corresponding to the overcharging detection threshold value or the overdischarging detection threshold value.

The microcomputer 40 carries out determination of overcharging/overdischarging of the battery 10 based on the first output and second output inputted from the first and second monitor circuits 50 and 60.

When the microcomputer 40 carries out self-diagnosis of characteristic shifts of the threshold values, the threshold switching section 41 switches the threshold used by the first monitor circuit 50 and the threshold used by the second monitor circuit 60 to a same value.

Specifically, the threshold switching section 41 outputs, to each of the first and second switching units 51 and 61, an instruction to sequentially switch the switches 56 and the switches 66 in the same manner to output stepwisely the threshold voltages from the first threshold value to the eighth threshold value. This causes the threshold voltages outputted from the first and second switching units 51 and 61 to be similarly shifted stepwise.

The fault detecting section 42 is adapted to detect that there is a fault in a threshold value if the compared result of the first monitor circuit 50 (first output) is different from the compared result of the second monitor circuit 60 (second output). The phrase "there is a fault in a threshold value" means that, in the first monitor circuit 50, a fault occurs in any one of the first switching unit 51, the first reference voltage source 51, and the first comparator 53 so that there is a characteristic shift of a threshold value. This is similarly established in the second monitor circuit 60. That is, the fault detecting section 42 detects a characteristic shift of a threshold value in the first switching unit 51 or the second switching unit 61 if the first output is different from the second output.

Specifically, the fault detecting section 42 receives the compared result outputted from the first comparator 53 and the compared result outputted from the second comparator 63 after the threshold of each of the first and second switching units 51 and 61 is shifted by one step by the threshold switching section 41. The fault detecting section 42 detects that there is a fault in a threshold value if the compared result of the first comparator 53 is different from the compared result of the second comparator 63. Because a threshold value is from the first threshold value to the eighth threshold value, the fault detecting section 42 carries out in turn comparison between the first output and the second output of the respective comparators 53 and 63 each time the threshold is stepwisely shifted.

The first output is identical to the second output if there are no characteristic shifts of the threshold values in either the first monitor circuit 50 or the second monitor circuit 60, and is different from the second output if there is a characteristic shift of a threshold value in either the first monitor circuit 50 or the second monitor circuit 60. Thus, detecting that the respective outputs are different from each other by the fault detecting section 42 allows a characteristic shift of a threshold value to be caused in the first monitor circuit 50 or the second monitor circuit 60.

These are the overall configuration of the voltage monitoring system including the voltage monitor 20 according to this embodiment.

Next, monitoring operations of the voltage monitor 20, that is, overcharging/overdischarging detecting operations will be described. The monitoring operations or the overcharging/overdischarging detecting operations of the voltage monitor 20 are started for example when the voltage monitor 20 is powered on or off, or the voltage monitor 20 receives an external instruction.

When carrying out the overcharging/overdischarging detecting function, the voltage monitor 20 operates in overcharging detecting mode and overdischarging detecting mode. In this embodiment, when the voltage monitor 20 is powered on or off, or the voltage monitor 20 receives an external instruction, the voltage monitor 20 is adapted to carry out the overcharging detecting function at first, and, after the completion of the overcharging detecting function, to carry out the overdischarging detecting function.

When the voltage monitor 20 starts operations in the overcharging detecting mode, instructions from the threshold switching section 41 to the first switching unit 51 of the first monitor circuit 50 switch between the switches 56, and instructions from the threshold switching section 41 to the second switching unit 61 of the second monitor circuit 60 switch between the second switches 66. This results in that a threshold voltage corresponding to the overcharging detection threshold is outputted from each of the first and second switching units 51 and 61.

At each of the comparators 53 and 63, the threshold voltage corresponding to the overcharging detection threshold value is compared with a corresponding one of the first and second reference voltages. The result of the comparison is inputted from each of the comparators 53 and 63 to the microcomputer 40.

Because each of the first and second reference voltages is constant, relative comparison between the threshold voltage corresponding to a divided value of the voltage of the battery 10 and each of the first and second reference voltages sufficiently means relative comparison between the voltage of the battery 10 and each of the first and second reference voltages that increases by the difference between the battery voltage and the threshold voltage.

In the microcomputer 40, whether the voltage of the battery 10 is overcharging is determined by whether the first and second outputs of the first and second comparators 53 and 63 are high levels or low levels. When the SOC of the battery 10 is a normal value, the threshold voltage, which changes depending on the battery voltage, corresponding to the overcharging detection threshold value (a very low divided value) is lower than each of the first and second reference voltages. Thus, the first and second outputs of the first and second comparators 53 and 63 are low levels, and outputted from the first and second comparators 53 and 63. It is therefore determined that there is no overcharging in the battery 10.

On the other hand, when the SOC of the battery 10 becomes, for example, its upper limit, the threshold voltage corresponding to the overcharging detection threshold value, which changes depending on the battery voltage, becomes higher than each of the first and second reference voltages. Thus, the first and second outputs of the first and second comparators 53 and 63 are high levels, and outputted from the first and second comparators 53 and 63. It is therefore determined that there is overcharging in the battery 10.

After completion of the overcharging detecting function, when the voltage monitor 20 starts operations in the overdischarging detecting mode, instructions from the threshold switching section 41 to the first switching unit 51 of the first monitor circuit 50 switch between the switches 56, and instructions from the threshold switching section 41 to the second switching unit 61 of the second monitor circuit 60 switch between the second switches 66. This results in that a threshold voltage corresponding to the overdischarging detection threshold value is outputted from each of the first and second switching units 51 and 61.

At each of the comparators 53 and 63, the threshold voltage corresponding to the overdischarging detection threshold value is compared with a corresponding one of the first and second reference voltages. The result of the comparison is inputted from each of the comparators 53 and 63 to the microcomputer 40.

In the microcomputer 40, whether the voltage of the battery 10 is overdischarging is determined by whether the first and second outputs of the first and second comparators 53 and 63 are high levels or low levels. When the SOC of the battery 10 is a normal value, the threshold voltage, which changes depending on the battery voltage, corresponding to the overdischarging detection threshold value (a high divided value close to the battery voltage) is higher than each of the first and second reference voltages. Thus, the first and second outputs of the first and second comparators 53 and 63 are high levels, and outputted from the first and second comparators 53 and 63. It is therefore determined that there is no overdischarging in the battery 10.

On the other hand, when the SOC of the battery 10 becomes, for example, its lower limit, the threshold voltage corresponding to the overdischarging detection threshold value, which changes depending on the battery voltage, becomes lower than each of the first and second reference voltages. Thus, the first and second outputs of the first and second comparators 53 and 63 are low levels, and outputted from the first and second comparators 53 and 63. It is therefore determined that there is overdischarging in the battery 10.

Note that, in this embodiment, overcharging detection and overdischarging detection are carried out based on the respective outputs of the first and second monitor circuits 50 and 60, but overcharging detection and overdischarging detection can be carried out based on only the output of any one of the first and second monitor circuits 50 and 60.

Figure 2:
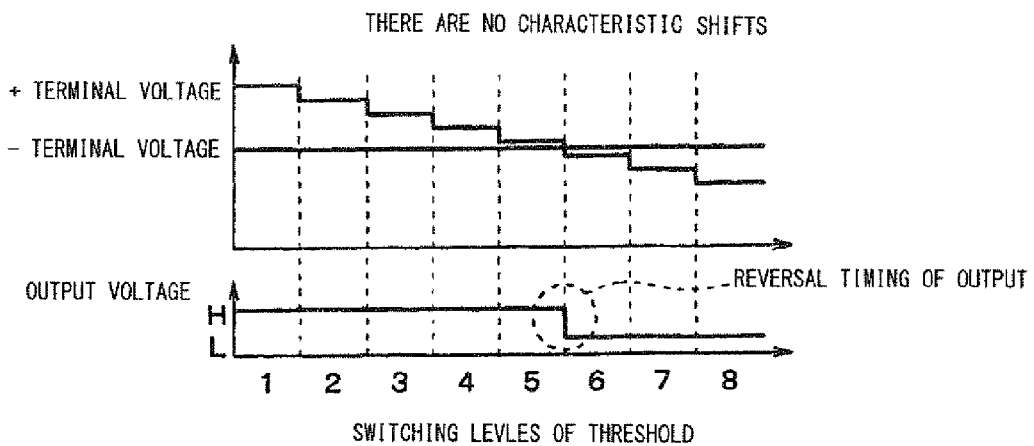
FIG. 2 is a timing chart indicative of inputs and outputs of first and second comparators when there are no threshold characteristic shifts in first and second switching units.
Figure 3:
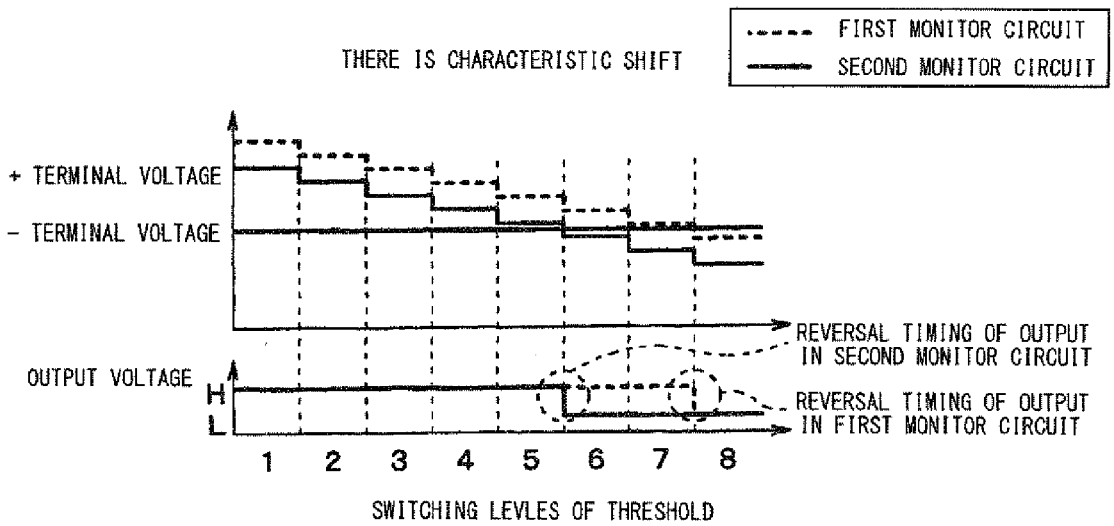
FIG. 3 is a timing chart indicative of inputs and outputs of the first and second comparators when there is a threshold characteristic shift in the first and second switching units.

Next, self-diagnostic operations of the voltage monitor 20 will be described with reference to FIGS. 2 and 3. FIG. 2 is a chart indicative of input and output timings of the first and second comparators 53 and 63 when there are no characteristic shifts of the threshold values in the first and second switching units 51 and 61. FIG. 3 is a chart indicative of input and output timings of the first and second comparators 53 and 63 when there is a characteristic shift of a threshold value in the first and second switching units 51 and 61.

When the voltage monitor 20 starts in self-diagnostic mode, to each of the first and second switching units 51 and 61, a first instruction of same information is outputted from the threshold switching section 41 at a same timing. Note that the "first instruction" is an instruction to cause each of the switching units 51 and 61 to output the threshold voltage corresponding to the first threshold value.

This causes the switches 56 of the first switching unit 51 to be switched to divide the voltage of the battery 10 so that the threshold voltage corresponding to the first threshold value is outputted from the first switching unit 51. Similarly, the switches 66 of the second switching unit 61 are switched to divide the voltage of the battery 10 so that the threshold voltage corresponding to the first threshold is outputted from the second switching unit 61.

In the first comparator 53, the first reference voltage inputted from the first reference voltage source 52 is compared with the threshold voltage inputted from the first switching unit 51. A result of the comparison is outputted to the fault detecting section 42 as the first output. Similarly, in the second comparator 63, the second reference voltage inputted from the second reference voltage source 62 is compared with the threshold voltage inputted from the second switching unit 61. A result of the comparison is outputted to the fault detecting section 42 as the second output.

In this case, if the threshold voltage is greater than each of the first and second reference voltages, each of the first and second outputs is a high-level signal. Otherwise, if the threshold voltage is lower than each of the first and second reference voltages, each of the first and second outputs is a low-level signal.

In the fault detecting section 42, the first output inputted from the first comparator 53 and the second output inputted from the second comparator 63 are compared with each other.

After a constant period of time, a second instruction is outputted at a same timing. The second instruction is an instruction to cause each of the switching units 51 and 61 to output the threshold voltage corresponding to the second threshold value. As well as when the first instruction is outputted, the first output of the first comparator 53 and the second output of the second comparator 63 are inputted to the fault detecting section 42 to be compared with each other.

Every constant period of time after the second instruction, a third instruction, a fourth instruction, . . . , and an eighth instruction are successively outputted from the threshold switching section 41. Thus, in each of the first and second switching units 51 and 61, the voltage of the battery 10 is divided by each of voltage-division ratios corresponding to the instructions. That is, the threshold of each of the first and second switching units 51 and 61 is successively switched from the first threshold value to the eighth threshold value, and the threshold voltages corresponding to the respective threshold values are successively outputted.

As described above, in each of the first and second switching units 51 and 61, the threshold is stepwisely switched from the first threshold value to the eighth threshold value so that the threshold voltages respectively corresponding to the threshold values are outputted. In other words, the first and second switching units 51 and 61 relatively change the respective first and second reference voltages step-by-step.

The self-diagnostic mode in which the threshold values of the respective first and second switching units 51 and 61 are stepwisely switched is carried out. If there are no characteristic shifts of the threshold values in the first and second monitor circuits 50 and 60, input/output of each of the switching units 51 and 61 is illustrated in FIG. 2.

The vertical axis of the upper timing chart in the upper and lower timing charts illustrated in FIG. 2 represents the voltage at the inverting input terminal (− terminal) of the first comparator 53 or the second comparator 63, and the voltage at the non-inverting input terminal (+ terminal) of the first comparator 53 or the second comparator 63. The vertical axis of the lower timing chart represents the output voltage of the first output of the first comparator 53 or the second output of the second comparator 63. The horizontal axis of each of the upper and lower timing charts represents the switching steps of each threshold from the first threshold value to the eighth threshold value.

As described above, the first switching unit 51 is completely identical in configuration to the second switching unit 61, and the first and second reference voltages generated by the first and second reference voltage sources 52 and 62 are completely identical to each other. Thus, if there are no characteristic shifts of the threshold values in the first and second monitor circuits 50 and 60, the threshold voltage and the first reference voltage inputted to the first comparator 53 have the waveforms illustrated in FIG. 2; these waveforms are identical to the waveforms of the threshold voltage and the second reference voltage inputted to the second comparator 63.

When the threshold switching section 41 stepwisely switches the output of each of the first and second switching units 51 and 61 from the first threshold value, if, for example, the threshold voltage corresponding to each of the first to fifth threshold values has the magnitude relation that is greater than the first and second reference voltages, the first output of the first comparator 53 and the second output of the second comparator 63 are the same high-level output voltage. That is, the compared results of the first and second comparators 53 and 63 are the same high-level output voltage.

If, at the sixth threshold value, the magnitude relation between the threshold voltage corresponding to the sixth threshold value and the first and second reference voltages is reversed so that the threshold voltage is lower than the first and second reference voltages, the first output of the first comparator 53 and the second output of the second comparator 63 are the same low-level output voltage. That is, the switching timing from the fifth threshold value to the sixth threshold value is the reversal timing of each output of the comparators 53 and 63, and the compared results of the first and second comparators 53 and 63 are the same low-level output voltage.

As described above, if there are no characteristic shifts of the threshold values in the first and second monitor circuits 50 and 60, the input/output of the first comparator 53 and that of the second comparator 63 are identical to each other as illustrated in FIG. 2. Thus, the fault detecting section 42 determines that the compared results from the first to eighth threshold values by the first monitor circuit 50 are identical to those from the first to eighth threshold values by the second monitor circuit 60, and, from the determination, detects that there no abnormalities in the first and second monitor circuits 50 and 60.

On the other hand, if there is a characteristic shift of a threshold value in the first and second monitor circuits 50 and 60, the input/output of the switching unit 51 is not identical to that of the second switching unit 61. There is a characteristic shift of a threshold value due to, for example, the change in the characteristics of the first reference voltage source 52 or the second reference voltage source 62, the variations in the resistances of the respective resistors 55, or the like.

For example, a case where there is a characteristic shift of a threshold value in the first monitor circuit 50 and there are no characteristic shifts of the threshold values in the second monitor circuit 60 will be described. The characteristic shift of a threshold value in the first monitor circuit 50 is that the output of the first switching unit 51 is significantly shifted by a constant value. Specifically, as illustrated in FIG. 3, the voltage at the non-inverting input terminal (+ terminal) of the first comparator 53 of the first monitor circuit 50 is greater by a constant value than the voltage at the non-inverting input terminal of the second comparator 63. Note that, the relationship between the vertical and horizontal axes of the upper and lower timing charts illustrated in FIG. 3 is the same as that illustrated in FIG. 2.

When the threshold switching section 41 stepwisely switches the output of each of the first and second switching units 51 and 61 from the first threshold value, if, for example, the threshold voltage corresponding to each of the first to fifth threshold values has the magnitude relation that is greater than the second reference voltage in the second monitor circuit 60, the first output of the first comparator 53 and the second output of the second comparator 63 are the same high-level output voltage. That is, the compared results of the first and second comparators 53 and 63 are the same high-level output voltage.

However, when the output of each of the first and second switching units 51 and 61 is switched to the sixth threshold value, the magnitude relation between the threshold voltage and the second reference voltage is reversed in the second monitor circuit 60 with no characteristic shifts in the threshold values, but the magnitude relation between the threshold voltage and the first reference voltage is not reversed in the first monitor circuit 50 with a characteristic shift of a threshold value. For this reason, the second output of the second comparator 63 is a low-level signal, but, as the first output of the first comparator 53, a high-level signal is kept. That is, the switching timing from the fifth threshold value to the sixth threshold value is the reversal timing of the second monitor circuit 60.

Similarly, when the threshold switching section 41 switches the output of each of the switching units 51 and 61 to the seventh threshold value, the high-level signal is kept as the first output of the first comparator 53, and the low-level signal is kept as the second output of the second comparator 63. That is, the compared result of the first comparator 53 and that of the second comparator 63 are different from each other at each of the sixth and seventh threshold values.

Thereafter, when the threshold switching section 41 switches the output of each of the switching units 51 and 61 to the eighth threshold value, the magnitude relation between the threshold voltage and the first reference voltage is reversed in the first monitor circuit 50 with a characteristic shift of a threshold value. For this reason, as the first output of the first comparator 53, a low-level signal is kept, and, as the second output of the second comparator 63, the low-level signal has been kept since the switching timing to the sixth threshold value. That is, the switching timing from the seventh threshold value to the eighth threshold value is the reversal timing of the first monitor circuit 50.

As described above, if there is a characteristic shift of a threshold value in the first monitor circuit 50, the input/output of the first comparator 53 and that of the second comparator 63 are that, as illustrated in FIG. 3, the compared result of the comparator 53 is different from that of the comparator 63 at each of the sixth and seventh threshold values. Thus, the fault detecting section 42 determines that the compared results from the first to eighth threshold values by the first monitor circuit 50 are different from those from the first to eighth threshold values by the second monitor circuit 60, and, from the determination, detects that there is an abnormality in the first and second monitor circuits 50 and 60. That is, the fault detecting section 42 detects that there is a characteristic shift of a threshold value based on the difference between the reversal timing of the first output and that of the second output. In this manner, it is detected that there is a characteristic shift of a threshold value.

As described above, this embodiment is characterized to:
output, to each of the first and second switching units 51 and 61 of the first and second monitor circuits 50 and 60, a same instruction that outputs a threshold voltage corresponding to each of the first to eighth threshold values; and
detect that there is a characteristic shift of a threshold value in each of the monitor circuits 50 and 60 by comparing, by the fault detecting section 42, each output of the first comparator 53 with a corresponding output of the second comparator 63.

Because the duplex circuit, which diagnoses the voltage of the battery 10 by the first and second monitor circuits 50 and 60, is constructed, it is possible to detect that there is a characteristic shift of a threshold value in any one of the first and second monitor circuits 50 and 60. Thus, it is possible to improve the accuracy of determination of characteristic shifts of threshold values.

This embodiment is characterized to switch, in each of the first and second switching units 51 and 61, among the eight levels from the first threshold value to the eighth threshold value for detecting a characteristic shift of a threshold value. Because of switching among several levels of threshold values, it is possible to prevent, although there is a characteristic shift of a threshold value, the magnitude relation between the threshold value and a reference voltage from being non-reversed. Specifically, even if the voltage of the battery 10 is kept unchanged, it is possible to obtain the compared result that the magnitude relation between a threshold value and a reference voltage is reversed, and the compared result that the magnitude relation between a threshold value and a reference voltage is not reversed. Thus, it is possible to detect that there is a characteristic shift of a threshold value based on these compared results. As described above, an increase in the number of threshold-switching steps can improve the accuracy of determination of threshold characteristic shifts.

Note that the correspondences between the descriptions of this embodiment and the claims are that the overcharging detection threshold value and the overdischarging threshold value correspond to a "monitor threshold value" in the claims, the first monitor circuit 50 corresponds to a "first means" in the claims, the second monitor circuit 60 corresponds to a "second means" in the claims, the first to eighth threshold values of the first switching unit 51 correspond to a "first diagnostic threshold value" in the claims, and the first to eighth threshold values in the second switching unit 61 correspond to a "second diagnostic threshold value" in the claims.

In addition, the first switching unit 51 corresponds to a "first voltage dividing means" in the claims, the second switching unit 61 corresponds to a "second voltage dividing means" in the claims, the threshold switching section 41 corresponds to a "threshold switching means" in the claims, and the fault detecting section 42 corresponds to a "fault detecting means" in the claims.

Other Embodiments

In the embodiment, the voltage monitor 20 detects overcharging/overdischarging of a secondary battery as the battery 10, but can monitor the voltage of a primary battery as the battery 10. If the voltage monitor 20 monitors the battery of a primary battery, a voltage to be detected corresponds to the monitor threshold.

In the embodiment, each of the first and second switching units 51 and 61 is configured to switch among the eight levels from the first threshold value to the eighth threshold value for self diagnosing a characteristic shift of a threshold, but can switch a threshold value by a same constant value in at least one single step. If there is a characteristic shift of the threshold value, switching the threshold value in only single step can detect different compared results of the respective first and second comparators 53 and 63 before and after the single-step switching.

In the embodiment, because the duplex circuit by the first and second monitor circuits 50 and 60 is constructed, the compared results of the first and second comparators 53 and 63 when a single threshold value (for example, the first threshold value) is set in each of the first and second monitor circuits 50 and 60 by the threshold switching section 41 can be compared with each other. If there is a wide characteristic shift of the single threshold value, the respective compared results can be different from each other without using stepwise threshold switching, using the single threshold value allows a characteristic shift of the single threshold value to be detected.

The embodiment has been described using a secondary battery as the battery 10. Such a secondary battery can be applied for a battery installed in an electric vehicle, such as a hybrid vehicle. Specifically, the voltage monitor 20 can serve to monitor the voltage of a battery installed in a vehicle. As described above, even if the voltage of the battery 10 is kept unchanged, stepwisely switching the threshold values detects a characteristic shift of a threshold value. For this reason, it is possible to diagnose a characteristic shift of a threshold value during the vehicle being stopped for example at a traffic light, or after the OFF of the ignition switch. In this case, because the vehicle is not moved, it is possible to diagnose a characteristic shift of a threshold value without being affected by noise caused by the travel of the vehicle, thus improving the accuracy of determination of threshold characteristic shifts.

The embodiment detects a fault based on the difference between the compared results of the first and second comparators 53 and 63 at the sixth threshold value or the seventh threshold value. In this fault detecting method, the fault detecting section 42 can be adapted to detect that there is a fault in a threshold value if the compared results of the first comparator 53 at two or more levels in the first to eighth threshold values are successively different from the corresponding compared results of the second comparator 63. Because a fault is detected when it is determined that the compared results of the first comparator 53 are successively different from the corresponding compared results of the second comparator 63, it is possible to eliminate a case where the respective compared results at one level are different from each other from any cause. Thus, false detection can be prevented, thus improving the accuracy of determination of threshold characteristic shifts.

In the embodiment, the overdischarging threshold value is higher than the first threshold value, and the overcharging detection threshold value is lower than the eighth threshold value, but these detection threshold values are an example. For example, the overdischarging threshold value can be within a range from the second threshold value to the third threshold value, and the overcharging detection threshold value can be within a range from the sixth threshold value to the seventh threshold value.

In the embodiment, the first to eighth threshold values are switched in descending order of their values, but can be switched in ascending order of their values.

In the embodiment, each of the first and second comparators 53 and 63 compares a threshold voltage corresponding to a threshold value (a divided value of the battery voltage) with a corresponding one of the first and second reference voltages, but the present invention is not limited to the structure.

Figure 4:
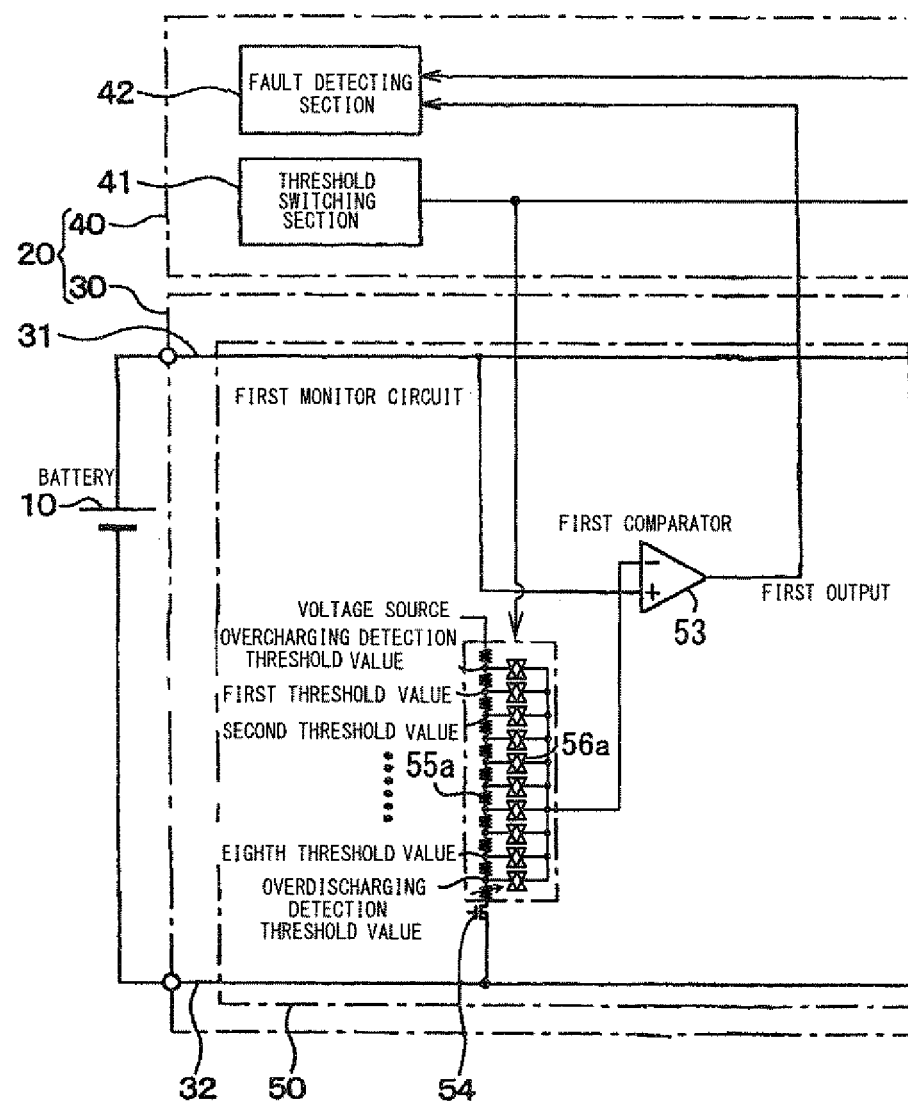
FIG. 4 is a view illustrating a part of the structure of a voltage monitoring system including a voltage monitor according to a modification of the embodiment of the present invention.

Specifically, as illustrated in FIG. 4, the first comparator 53 can be configured to compare the battery voltage with a threshold voltage corresponding to any one of the overcharging detection threshold value, the first to eighth threshold values, and the overdischarging threshold value. In this modification, the overcharging detection threshold value is obtained by dividing a constant voltage from a voltage source by the ratio of the first resistor 55a1 to the sum of the remaining resistors 55a2 to 55a1. For example, in this modification, the overcharging detection threshold value is set to 4.25 V, and the overdischarging threshold value is set to 1.75 V. The second comparator 63 has the same configuration as the first comparator 53.

DESCRIPTION OF CHARACTERS

10 Battery
41 Threshold switching section (threshold switching means)
42 Fault detecting section (fault detecting means)
50 First monitor circuit (first comparing means)
51 First switching unit (first voltage dividing means)
52 First reference voltage source
53 First comparator
60 Second monitor circuit (Second comparing means)
61 Second switching unit (Second voltage dividing means)
62 Second reference voltage source
63 Second comparator

The invention claimed is:

1. A voltage monitor for monitoring a voltage of a battery based on a monitor threshold value and for diagnosing the voltage of the battery based on first and second diagnostic threshold values, the voltage monitor comprising:
   a first means that obtains a first relative correlation between the voltage of the battery and any one of the monitor threshold value and the first diagnostic threshold value, and outputs first information indicative of the obtained first relative correlation;
   a second means that obtains a second relative correlation between the voltage of the battery and any one of the monitor threshold value and the second diagnostic threshold value, and outputs second information indicative of the obtained second relative correlation;
   a threshold switching means that switches a threshold used by the first means to the monitor threshold value and a threshold used by the second means to the monitor threshold value when carrying out the monitor, and that switches the threshold used by the first means to the first diagnostic threshold value and the threshold used by the second means to the second diagnostic threshold value that is a same value as the first diagnostic threshold value when carrying out the diagnosis; and
   a fault detecting means that:

receives the first information outputted from the first means and the second information outputted from the second means after the first and second threshold values have been switched to the same value; and
detects that there is a fault in a threshold switched by the threshold switching means if the first information of the first means is different from the second information of the second means.

2. The voltage monitor according to claim 1, wherein the threshold switching means switches the first diagnostic threshold value and the second diagnostic threshold value in several steps.

3. The voltage monitor according to claim 2, wherein the fault detecting means detects that there is a fault in one of the threshold used by the first means and the threshold used by the second means if values of the first information at two or more steps in the several steps are successively different from corresponding values of the second information at the same two or more steps in the several steps.

4. The voltage monitor according to claim 1, wherein the first means comprises:
a first voltage dividing means that outputs a voltage corresponding to one of the monitor threshold value and the first diagnostic threshold value as a divided voltage of the voltage of the battery;
a first reference voltage source that outputs a first reference voltage; and
a first comparator that receives the divided voltage of the first voltage dividing means and the first reference voltage of the first reference voltage source, and that outputs a result of a comparison between the divided voltage of the first voltage dividing means and the first reference voltage of the first reference voltage source as the first information,
the second means comprises:
a second voltage dividing means that outputs a voltage corresponding to one of the monitor threshold value and the second diagnostic threshold value as a divided voltage of the voltage of the battery;
a second reference voltage source that outputs a second reference voltage; and
a second comparator that receives the divided voltage of the second voltage dividing means and the second reference voltage of the second reference voltage source, and that outputs a result of a comparison between the divided voltage of the second voltage dividing means and the second reference voltage of the second reference voltage source as the second information, and
the threshold switching means switches each of a ratio of the divided voltage of the first voltage dividing means relative to the voltage of the battery and a ratio of the divided voltage of the second voltage dividing means relative to the voltage of the battery to switch the threshold used by the first means to the first diagnostic threshold value, and switch the threshold used by the second means to the second diagnostic threshold value.

5. The voltage monitor according to claim 1, wherein the first and second diagnostic threshold values are set to be within a voltage range to be used by the battery.

6. The voltage monitor according to claim 1, wherein the first means comprises:
a first voltage dividing means that divides a reference voltage to output a divided voltage corresponding to one of the monitor threshold value and the first diagnostic threshold value; and
a first comparator that receives the divided voltage of the first voltage dividing means and the voltage of the battery, and compares the divided voltage with the voltage of the battery to output a result of the comparison as the first information,
the second means comprises:
a second voltage dividing means that divides the reference voltage to output a divided voltage corresponding to one of the monitor threshold value and the second diagnostic threshold value; and
a second comparator that receives the divided voltage of the second voltage dividing means and the voltage of the battery, and compares the divided voltage with the voltage of the battery to output a result of the comparison as the second information, and
the threshold switching means switches each of a ratio of the divided voltage of the first voltage dividing means relative to the voltage of the battery and a ratio of the divided voltage of the second voltage dividing means relative to the voltage of the battery to switch the threshold used by the first means to the first diagnostic threshold value, and switch the threshold used by the second means to the second diagnostic threshold value.

7. A voltage monitor for monitoring a voltage of a battery based on a monitor threshold value and for diagnosing the voltage of the battery based on first and second diagnostic threshold values, the voltage monitor comprising:
a first monitor configured to obtain a first relative correlation between the voltage of the battery and any one of the monitor threshold value and the first diagnostic threshold value, and output first information indicative of the obtained first relative correlation;
a second monitor configured to obtain a second relative correlation between the voltage of the battery and any one of the monitor threshold value and the second diagnostic threshold value, and output second information indicative of the obtained second relative correlation; and
a computer configured to:
switch a threshold used by the first monitor to the monitor threshold value and a threshold used by the second monitor to the monitor threshold value when performing the monitoring;
switch the threshold used by the first monitor to the first diagnostic threshold value and the threshold used by the second monitor to the second diagnostic threshold value that is a same value as the first diagnostic threshold value when performing the diagnosis;
receive the first information outputted from the first monitor and the second information outputted from the second monitor after the first and second threshold values have been switched to the same value; and
detect that there is a fault in the switching of the threshold if the first information of the first monitor is different from the second information of the second monitor.

* * * * *